United States Patent
Suzuki et al.

(10) Patent No.: US 9,171,745 B2
(45) Date of Patent: Oct. 27, 2015

(54) SUBSTRATE TREATMENT APPARATUS AND METHOD FOR MANUFACTURING THIN FILM

(75) Inventors: Mitsuhiro Suzuki, Nagareyama (JP); Takeshi Kijima, Nagareyama (JP); Yuuji Honda, Nagareyama (JP)

(73) Assignee: YOUTEC CO., LTD., Chiba (JP)

( * ) Notice: Subject to any disclaimer, the term of this patent is extended or adjusted under 35 U.S.C. 154(b) by 22 days.

(21) Appl. No.: 13/643,873

(22) PCT Filed: Apr. 28, 2010

(86) PCT No.: PCT/JP2010/057919
§ 371 (c)(1),
(2), (4) Date: Nov. 14, 2012

(87) PCT Pub. No.: WO2011/135731
PCT Pub. Date: Nov. 3, 2011

(65) Prior Publication Data
US 2013/0059076 A1  Mar. 7, 2013

(51) Int. Cl.
*B05C 11/08* (2006.01)
*B05D 3/12* (2006.01)
*H01L 21/67* (2006.01)
*B05C 11/02* (2006.01)
(Continued)

(52) U.S. Cl.
CPC ........ *H01L 21/67017* (2013.01); *B05C 11/023* (2013.01); *B05C 11/08* (2013.01); *H01L 21/02197* (2013.01); *H01L 21/02282* (2013.01); *H01L 21/6715* (2013.01); *H01L 21/67196* (2013.01); *H01L 21/67207* (2013.01); *B05D 1/005* (2013.01); *B05D 3/0486* (2013.01)

(58) Field of Classification Search
None
See application file for complete search history.

(56) References Cited

U.S. PATENT DOCUMENTS

| 2004/0087068 A1 | 5/2004 | Yudasaka |
| 2007/0267461 A1* | 11/2007 | Yu et al. .............. 228/101 |
| 2009/0056116 A1 | 3/2009 | Presley et al. |

FOREIGN PATENT DOCUMENTS

| JP | 11-145424 | 5/1999 |
| JP | 2000-9434 | 1/2000 |

(Continued)

OTHER PUBLICATIONS

Extended European Search Report issued Dec. 17, 2013 in corresponding European patent application No. 10 85 0746.

(Continued)

*Primary Examiner* — Dah-Wei D Yuan
*Assistant Examiner* — Jethro M Pence
(74) *Attorney, Agent, or Firm* — Wenderoth, Lind & Ponack, L.L.P.

(57) ABSTRACT

To provide a substrate treatment apparatus capable of suppressing adherence of dust to a film coated on a substrate. As an aspect of the present invention is a substrate treatment apparatus provided with a spin-coating treatment chamber 4a for coating a film on the substrate by spin-coating, a first air-conditioning mechanism that regulates an amount of dust in the air in the spin-coating treatment chamber, an annealing treatment chamber 7a for performing lamp annealing treatment on the film coated on the substrate, a conveying chamber 2a that is connected to each of the spin-coating treatment chamber and the annealing treatment chamber and is for conveying the substrate between the spin-coating treatment chamber and the annealing treatment chamber each other, and a second air-conditioning mechanism that regulate an amount of dust in the air in the conveying chamber.

13 Claims, 11 Drawing Sheets

(51) Int. Cl.
*H01L 21/02* (2006.01)
*B05D 3/04* (2006.01)
*B05D 1/00* (2006.01)

(56) References Cited

FOREIGN PATENT DOCUMENTS

| JP | 2000-114345 | 4/2000 |
| JP | 2004-319995 | 11/2004 |
| JP | 2007-59631 | 3/2007 |
| JP | 2007-180398 | 7/2007 |
| JP | 2007-329030 | 12/2007 |
| WO | 2006/087777 | 8/2006 |

OTHER PUBLICATIONS

International Search Report issued Jun. 1, 2010 in International Application No. PCT/JP2010/57919.

* cited by examiner

FIG. 5A
FIG. 5B
PZT THICK FILM OF THE
PRESENT INVENTION
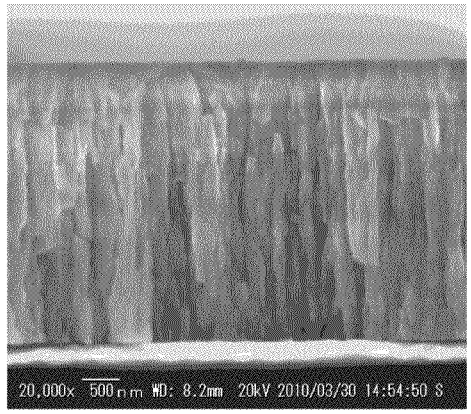
CONVENTIONAL EXAMPLE 1
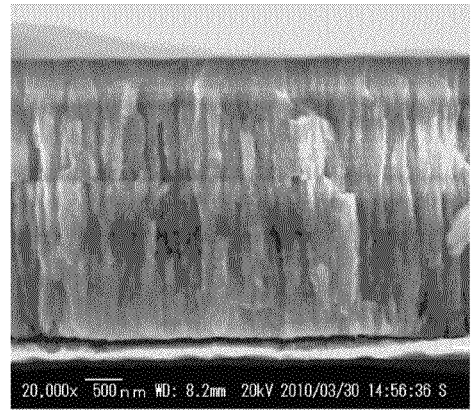

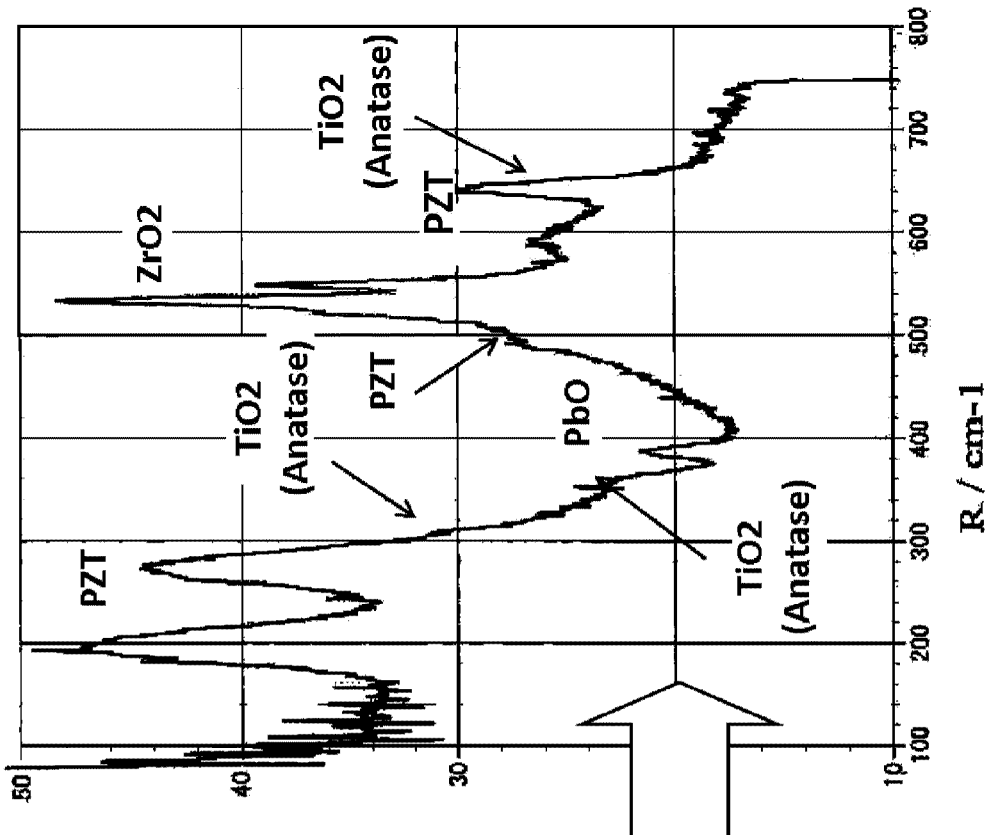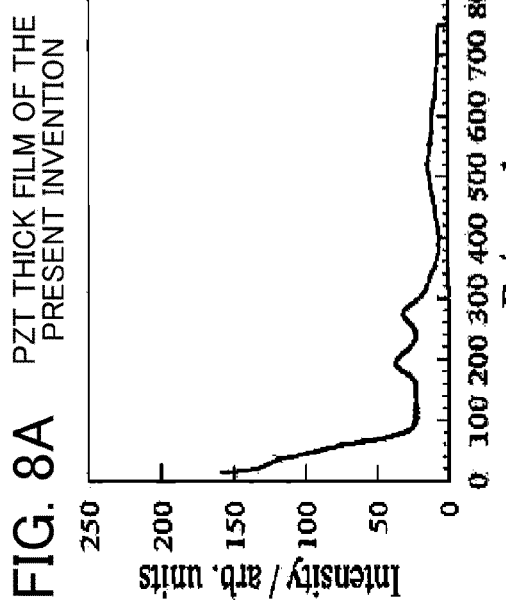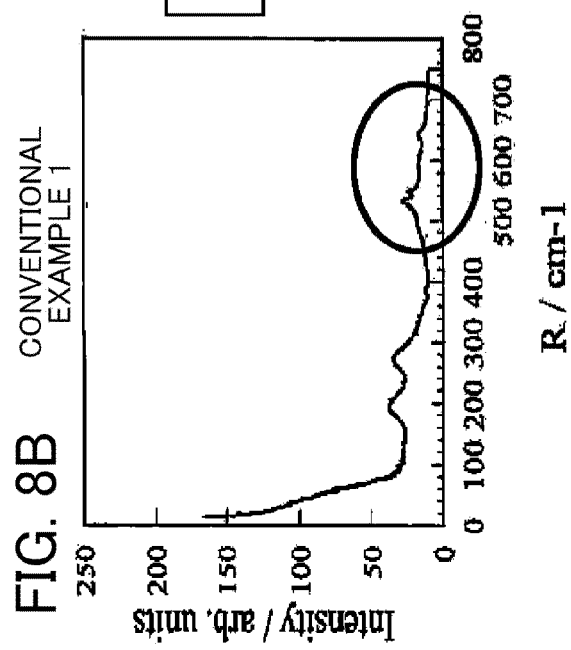

SUBSTRATE TREATMENT APPARATUS AND METHOD FOR MANUFACTURING THIN FILM

TECHNICAL FIELD

The present invention relates to a substrate treatment apparatus provided with a spin coater and a method for manufacturing a thin film by using the substrate treatment apparatus.

BACKGROUND ART

A conventional method for manufacturing a PZT film will be explained.

On a 4-inch wafer, for example, a (111)-oriented Pt film is formed, and, on the Pt film, a PZT sol-gel solution is spin-coated by a spin coater. Next, the coated PZT sol-gel solution is held and heated on a hot plate and dried to remove moisture, and, after that, is held and heated furthermore on a hot plate kept at a higher temperature to perform temporary calcination. By the repletion of these a plurality of times, an amorphous PZT is generated.

Next, the amorphous PZT after having been temporarily calcined is subjected to annealing treatment by using a pressurized lamp annealing apparatus (RTA: rapidly thermal anneal) to perform PZT crystallization (refer to, for example, Patent Document 1).

REFERENCE DOCUMENT

Patent Document 1: WO 2006/087777

DISCLOSURE OF THE INVENTION

Problems that the Invention is to Solve

In the conventional manufacturing method, there is such a problem to be solved in which dust, dirt, contaminant and the like adhere to a film coated on the substrate, in the process of spin-coating the solution on the substrate by a spin coater and in a process of conveying the wafer between the spin coater and the annealing apparatus.

Furthermore, there is such a case where formation of a very thick film on a substrate is required. In this case, it is necessary to repeat many times the process of spin-coating a solution on a substrate by a spin coater and the process of calcining temporarily the coated film. In such a case, if an operator operates substrate conveyance between the spin coater and an apparatus for temporary calcination, enhancement of productivity is limited.

An aspect of the present invention aims at providing a substrate treatment apparatus capable of suppressing adherence of dust to a film coated on a substrate, and a method for manufacturing a thin film using the substrate treatment apparatus.

Furthermore, another aspect of the present invention aims at providing a substrate treatment apparatus capable of improving productivity when forming a very thick film on a substrate, and a method for manufacturing a thin film using the same.

Means for Solving the Problems

An aspect of the present invention is a substrate treatment apparatus characterized by including:

a spin-coating treatment chamber for coating a film on a substrate by spin-coating;

a first air-conditioning mechanism that regulates an amount of dust in the air in the spin-coating treatment chamber;

an annealing treatment chamber for performing lamp annealing treatment on the film coated on the substrate;

a conveying chamber that is connected to each of the spin-coating treatment chamber and the annealing treatment chamber and is for conveying the substrate between the spin-coating treatment chamber and the annealing treatment chamber with each other; and a second air-conditioning mechanism that regulates an amount of dust in the air in the conveying chamber.

In an aspect of the present invention, it is also possible to include furthermore a temporary calcination treatment chamber that is connected to the inside of the conveying chamber and is for performing temporary calcination for the film coated on the substrate.

In an aspect of the present invention, it is also possible to include furthermore:

a drying treatment chamber that is connected to the conveying chamber and is for performing a drying treatment on the film coated on the substrate; and an exhaust mechanism that exhausts an inside of the drying treatment chamber.

In an aspect of the present invention, it is also possible:

that a holding mechanism that holds the substrate is arranged in the drying treatment chamber; and that the exhaust mechanism has an exhaust port arranged facing the substrate held by the holding mechanism to exhaust directly the air over an surface of the film coated on the substrate from the exhaust port.

In an aspect of the present invention, it is also possible to include furthermore:

an alignment treatment chamber that is connected to the inside of the conveying chamber and is for detecting a center position of a surface of the substrate; and a third air-conditioning mechanism that regulates an amount of dust in the air in the alignment treatment chamber.

In an aspect of the present invention, it is also possible that a conveying mechanism that conveys the substrate is provided in the conveying chamber.

In an aspect of the present invention, it is also possible that the first air-conditioning mechanism controls temperature, humidity or an airflow volume.

In an aspect of the present invention, it is also possible to perform the lamp annealing treatment in any of pressurized, ordinary pressure and depressurized states.

An aspect of the present invention is a method for manufacturing a thin film on a substrate by using the above-mentioned substrate treatment apparatus, the method including:

a first step of coating a film on the substrate by spin-coating in the spin-coating treatment chamber in which an amount of dust in the air is regulated by the first air-conditioning mechanism;

after the first step, a second step of conveying the substrate in the spin-coating treatment chamber into the temporary calcination treatment chamber through the conveying chamber;

after the second step, a third step of performing temporary calcination on the film on the substrate in the temporary calcination treatment chamber;

after the third step, a fifth step of stacking and forming a plurality of films on the substrate by repeating a fourth step of conveying the substrate in the temporary calcination treatment chamber into the spin-coating treatment chamber through the conveying chamber, the first step, the second step and the third step;

after the fifth step, a sixth step of conveying the substrate in the temporary calcination treatment chamber into the annealing treatment chamber through the conveying chamber; and after the sixth step, a seventh step of performing lamp annealing treatment on the plurality of films on the substrate in the annealing treatment chamber, wherein, in the conveying chamber, an amount of dust in the air is regulated by the second air-conditioning mechanism.

In an embodiment of the present invention, the temporary calcination is preferably performed in a vacuum atmosphere, in a nitrogen atmosphere or in an inert gas atmosphere.

Advantage of the Invention

According to an aspect of the present invention, it is possible to provide a substrate treatment apparatus capable of suppressing adherence of dust to a film coated on a substrate, and a method for manufacturing a thin film using the same.

In addition, according to an aspect of the present invention, it is possible to provide a substrate treatment apparatus capable of improving productivity when a very thick film is to be formed on a substrate, and a method for manufacturing a thin film using the same.

BRIEF DESCRIPTION OF THE DRAWINGS

FIG. 5A is a SEM cross-section image of a 5 μm PZT thick film of the present invention (Example), and FIG. 5B is a SEM cross-section image of a 5 μm PZT thick film in Conventional example 1.

FIGS. 8A to 8C are drawings showing results of Raman spectroscopic analysis for a PZT thick film of the present invention (Example) and a PZT thick film in Conventional example 1.

BEST EMBODIMENT FOR CARRYING OUT THE INVENTION

Hereinafter, embodiments of the present invention will be explained in detail using the drawings. However, a person skilled in the art understands easily that the present invention is not limited to following explanation, but that aspects and details thereof can be modified in various ways without departing from the gist and the range of the present invention. Accordingly, the present invention should not be construed while limiting the present invention to the described contents of embodiments shown below.

Figure 1:
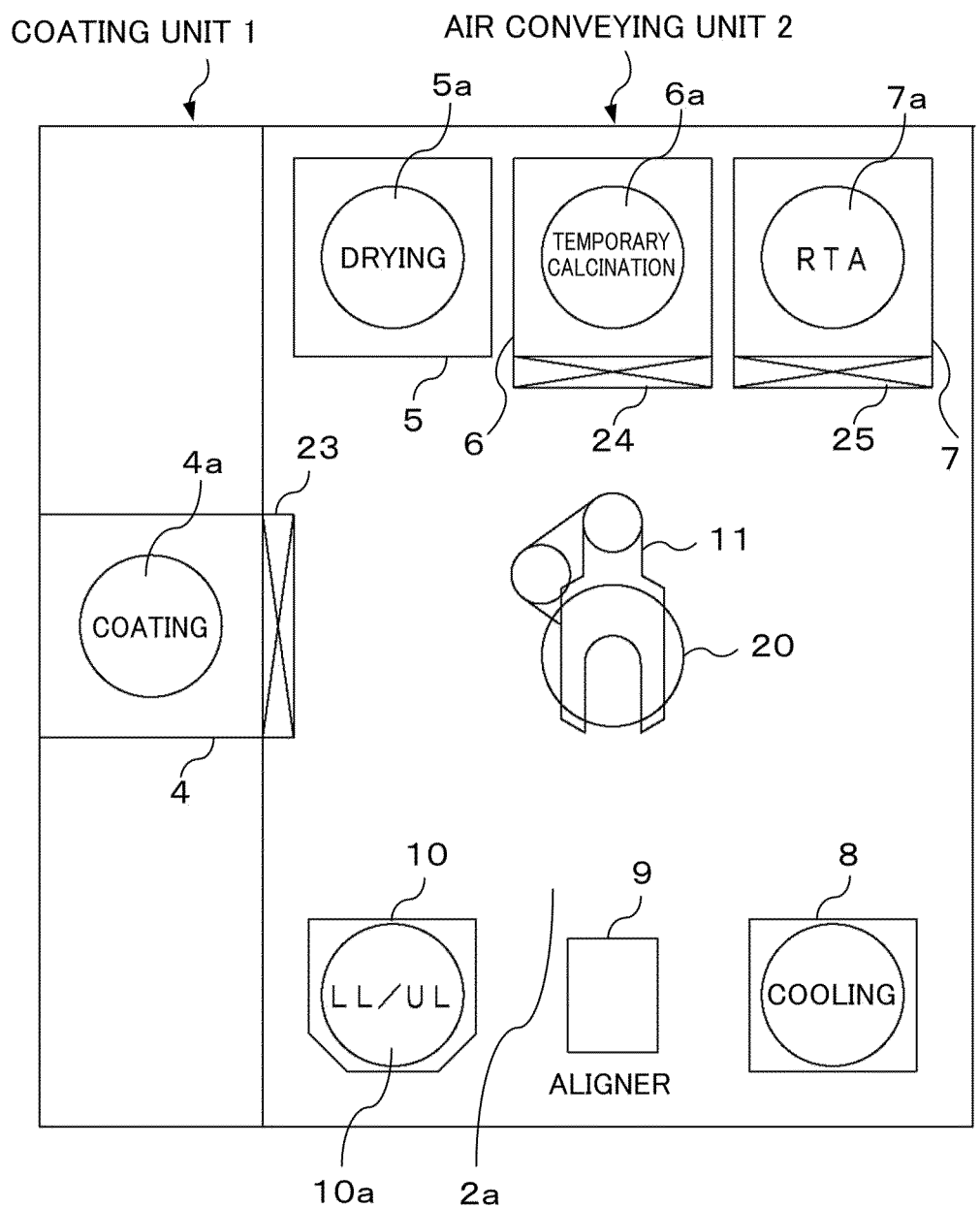
FIG. 1 is a schematic view showing the configuration of the substrate treatment apparatus according to an embodiment.
Figure 2:
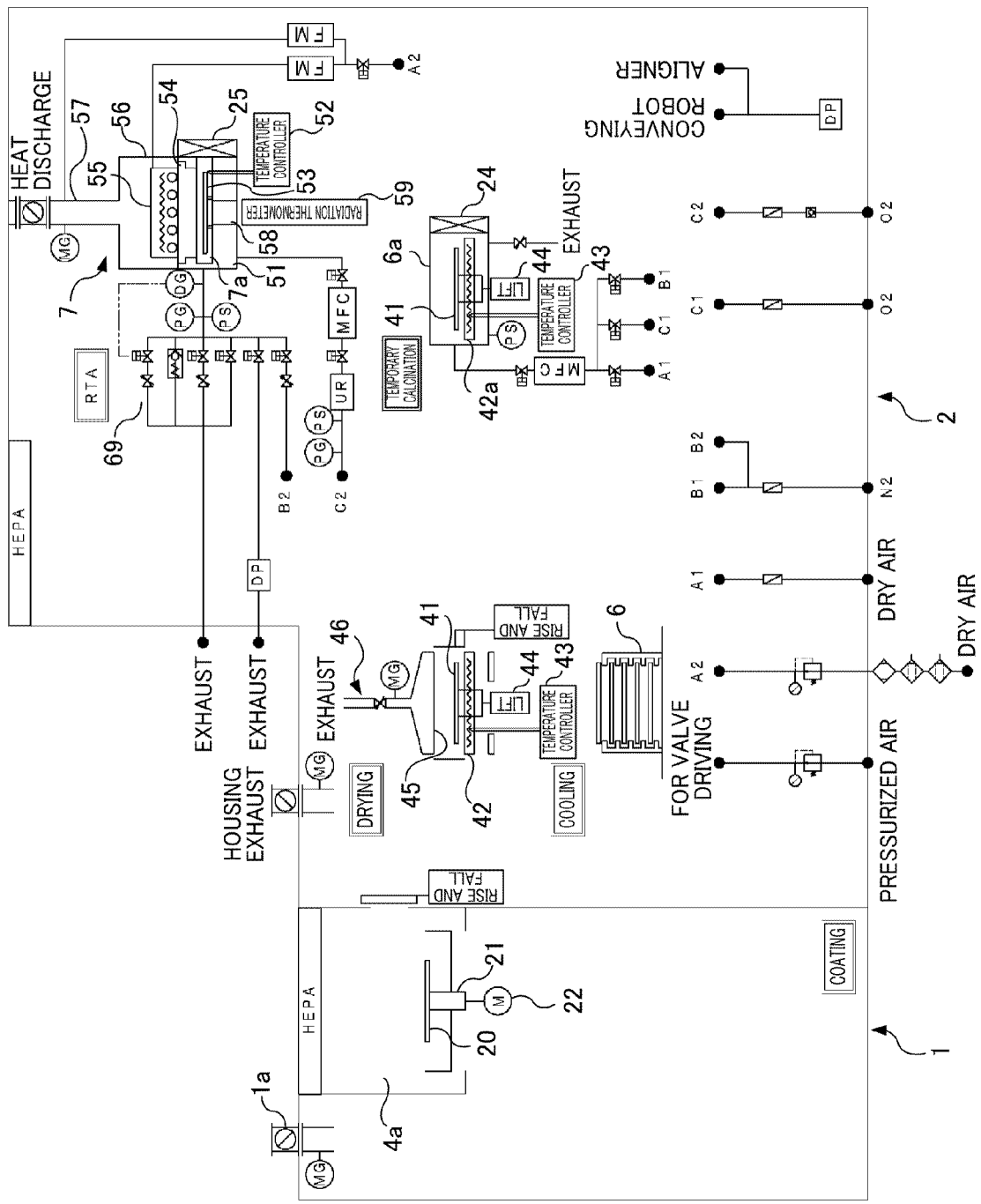
FIG. 2 is a drawing showing in detail each of a coating unit 1 and an air conveying unit 2 shown in FIG. 1.
Figure 3:
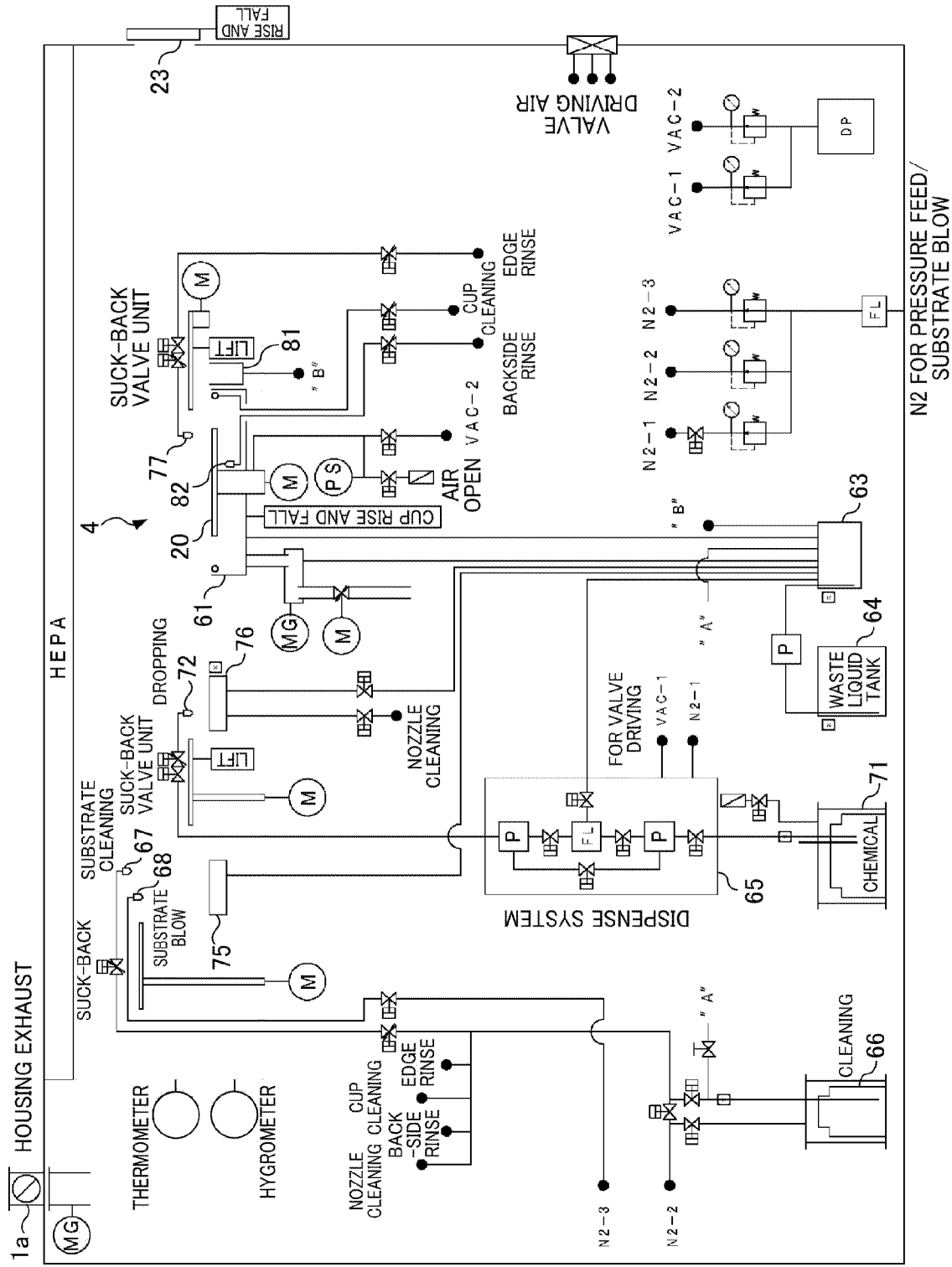
FIG. 3 is a drawing showing in detail the coating unit 1 shown in FIGS. 1 and 2.
Figure 4A:
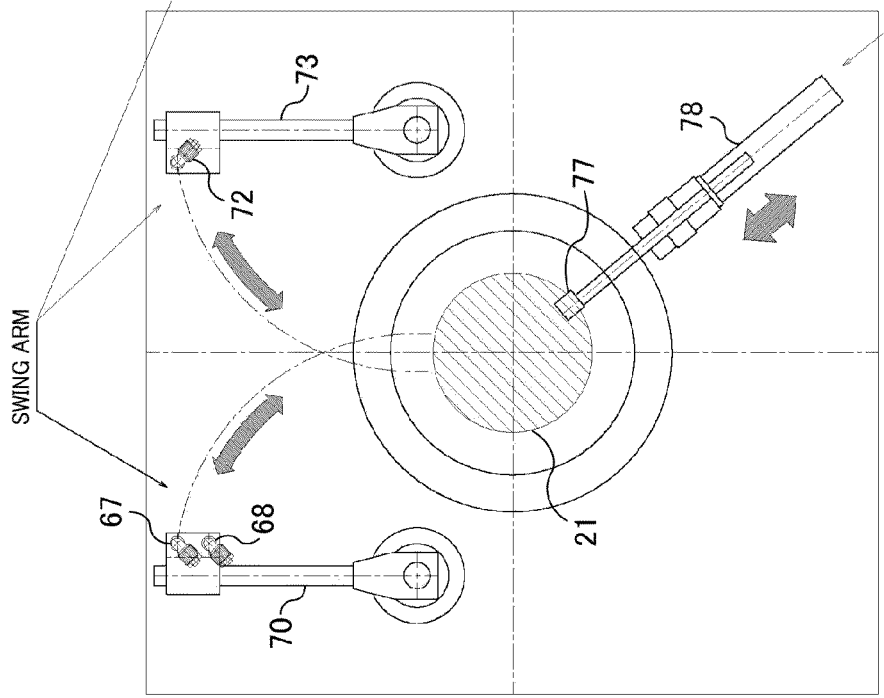
FIG. 4A is a plan view of a spin coater shown in FIG. 1.
Figure 4B:
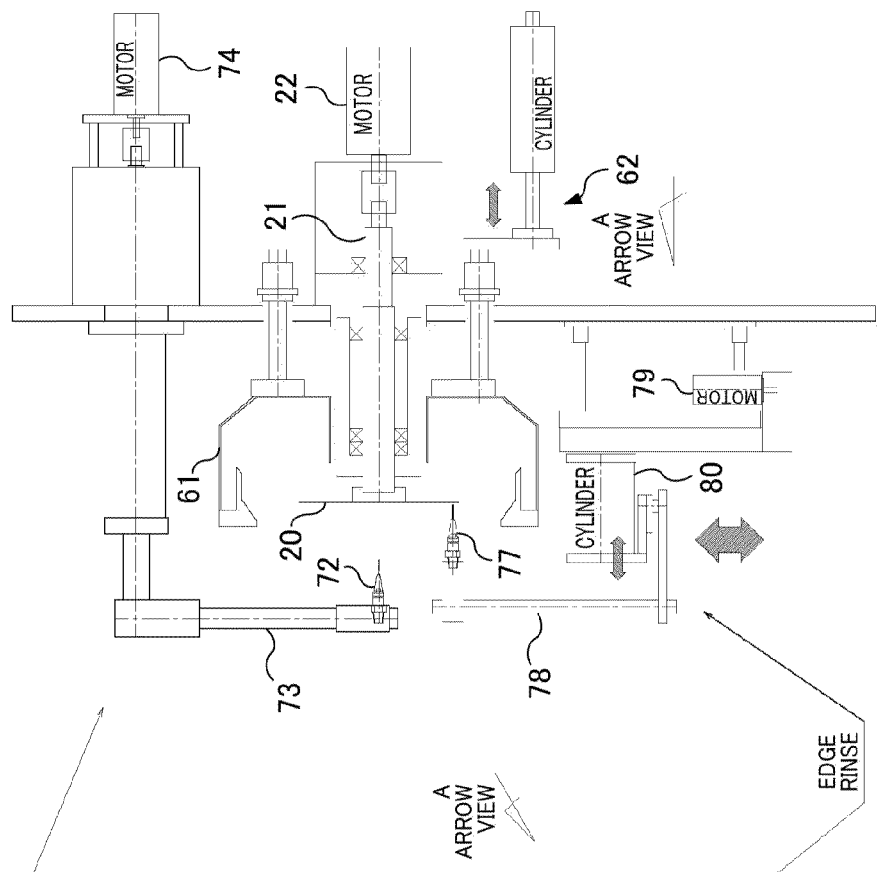
FIG. 4B is an A arrow view of the spin coater shown in FIG. 4A.

FIG. 1 is a schematic view showing the configuration of the substrate treatment apparatus according to the embodiment. FIG. 2 is a drawing showing in detail each of a coating unit 1 and an air conveying unit 2 in the substrate treatment apparatus shown in FIG. 1. FIG. 3 is a drawing showing in detail the coating unit 1 shown in FIGS. 1 and 2. FIG. 4A is a plan view of a spin coater shown in FIG. 1, and FIG. 4B is an A arrow view of the spin coater shown in FIG. 4A.

As shown in FIG. 1, the substrate treatment apparatus has the coating unit 1 having a spin coater 4, and the air conveying unit 2 having a conveying chamber 2a.

First, the coating unit 1 will be explained in detail. The air conveying unit 2 will be described later.

As shown in FIG. 2, the coating unit 1 has an exhaust mechanism 1a that exhausts an inside thereof and an inside of a spin-coating treatment chamber 4a. The spin coater 4 has the spin-coating treatment chamber 4a for coating a film on a substrate 20 by spin-coating, a holding mechanism 21 that holds a substrate arranged in the spin-coating treatment chamber 4a, and a rotation mechanism 22 having a motor that rotates the substrate 20.

In the coating unit 1, there is provided an air-conditioning mechanism that regulates an amount of dust in the air in the spin-coating treatment chamber 4a. The air-conditioning mechanism has a hepafilter. By the air-conditioning mechanism, the amount of dust in the air in the spin-coating treatment chamber 4a can be made smaller than that in the outside air. Note that the air-conditioning mechanism can also control temperature, humidity or an airflow volume in the spin-coating treatment chamber 4a.

As shown in FIG. 3, the holding mechanism 21 has a stage, and has a configuration in which a substrate is held by evacuating the rear side of the substrate placed on the stage by a vacuum pump DP. To the holding mechanism 21, a mechanism that performs opening to the atmosphere after evacuating the rear side of the substrate, is connected.

As shown in FIGS. 3 and 4, the spin coater 4 has a cup 61 that covers the periphery of the substrate 20 held by the holding mechanism 21. To the cup 61, a moving mechanism 62 having a cylinder is connected, and the moving mechanism 62 is a mechanism that moves the cup 61 up and down.

The cup 61 is connected to a waste liquid tank 63 through piping. The waste liquid tank 63 is a tank in which liquid accumulating in the cup 61 by performing spin-coating treatment is stored. The waste liquid tank 63 is connected to a waste liquid tank 64 via a pump P.

In addition, the spin coater 4 also has a cleaning nozzle 67. The cleaning nozzle 67 is connected to a cleaning liquid supply source 66 via a valve and piping. The cleaning nozzle 67 is fixed to a first swing arm 70, and it is configured such that the first swing arm 70 is rotated and moved by a motor (see FIG. 4A). Consequently, it is possible to move the cleaning nozzle 67 to the upper side of the substrate when supplying a cleaning liquid to the substrate 21.

In a standby position of the cleaning nozzle 67, a cup 75 that receives a cleaning liquid is arranged. The cup 75 is connected to the waste liquid tank 63 via piping.

In addition, the spin coater 4 has a blow nozzle 68. The blow nozzle 68 is connected to a nitrogen gas supply source for pressure feed/substrate blow via a valve and piping. The blow nozzle 68 is fixed to the first swing arm. Consequently, it is possible to move the blow nozzle 68 to the upper side of the substrate when supplying nitrogen gas to a surface of the substrate 21.

The piping connecting the cleaning liquid supply source 66 with the cleaning nozzle 67 is configured such that the cleaning liquid is pressure-fed by nitrogen gas because the nitrogen gas supply source for pressure feed/substrate blow is connected via a valve.

Furthermore, the spin coater 4 has a dropping nozzle 72. The dropping nozzle 72 is connected to a chemical material supply source 71 via piping and a dispense system 65. The dropping nozzle 72 is fixed to a second swing arm 73, and it is configured such that the second swing arm 73 is rotated and moved by a motor 74 (see FIG. 4A and FIG. 4B). Consequently, it is possible to move the dropping nozzle 72 to the upper side of the substrate when supplying the chemical material to the substrate 21.

The dispense system 65 is a system that conveys the chemical material from the chemical material supply source 71 to the dropping nozzle 72 and makes the material to be dropped onto the substrate. Note that the dispense system 65 is connected to the waste liquid tank 63 via piping. In addition, to the dispense system 65, the vacuum pump DP is connected via piping. The dispense system 65 is connected to a nitrogen gas supply source for pressure feed/substrate blow via piping and a valve.

To a standby position of the dropping nozzle 72, a cup 76 that receives the chemical material is arranged, and, for the cup 76, a liquid level sensor that senses the liquid level in the cup is provided. The cup 76 is connected to the waste liquid tank 63 via a valve and piping.

Moreover, the cup 76 is also connected to the cleaning liquid supply source 66 via piping and a valve. Consequently, it is configured such that the dropping nozzle 72 can be cleaned by a cleaning liquid.

Furthermore, the spin coater 4 also has an edge rinse nozzle 77. The edge rinse nozzle 77 is connected to a cleaning liquid supply source via a valve and piping. The edge rinse nozzle 77 is fixed to a third swing arm 78. It is configured such that the third swing arm 78 is rotated and moved by a motor 79, and is moved up and down by a cylinder 80 (see FIG. 4A and FIG. 4B). Consequently, it is possible to move the edge rinse nozzle 77 to the upper side of the substrate when supplying the cleaning liquid to an edge part of the surface of the substrate 21.

In the standby position of the edge rinse nozzle 77, a cup 81 that receives a cleaning liquid is arranged. The cup 81 is connected to the waste liquid tank 63 via piping.

Furthermore, the cup 61 is connected to the cleaning liquid supply source 66 via piping and a valve. Consequently, it is configured such that the cup 61 can be cleaned by the cleaning liquid.

Moreover, the spin coater 4 has a backside rinse nozzle 82 that rinses the backside of the substrate. The backside rinse nozzle 82 is arranged in the cup 61. The backside rinse nozzle 82 is connected to the cleaning liquid supply source 66 via piping and a valve. Consequently, it is configured such that the backside of the substrate can be cleaned by the cleaning liquid.

In addition, the above-mentioned valves are connected to an air supply source for driving a valve via piping.

Next, the air conveying unit 2 will be explained in detail.

As shown in FIG. 1, for the air conveying unit 2, there are arranged a drying apparatus 5 having a drying treatment chamber 5a that performs drying at a temperature of 150° C. to 300° C., a temporary nitrogen calcination apparatus 6 having a temporary nitrogen calcination treatment chamber 6a that performs temporary calcination, for example, at a temperature of 300° C. to 600° C. and at ordinary pressure in a nitrogen atmosphere or in an inert gas atmosphere, a pressurizing lamp annealing apparatus 7 having an annealing treatment chamber 7a, a cooling apparatus 8 having a cooling treatment chamber, an aligner 9 having an alignment treatment chamber, a load/unload apparatus 10 having a load/unload chamber 10a, and a conveying mechanism 11.

The conveying chamber 2a of the air conveying unit 2 is connected to the spin-coating treatment chamber 4a via a gate valve 23, connected to the load/unload chamber 10a, connected to the alignment treatment chamber, connected to the cooling treatment chamber, connected to the drying treatment chamber 5a, connected to the temporary calcination treatment chamber 6a through a gate valve 24, and connected to the annealing treatment chamber 7a via a gate valve 25.

The conveying mechanism 11 of the air conveying unit 2 is a mechanism for conveying the substrate 20 to each of the spin-coating treatment chamber 4a, the load/unload chamber 10a, the alignment treatment chamber, the cooling treatment chamber, the drying treatment chamber 5a, the temporary calcination treatment chamber 6a, the annealing treatment chamber 7a, a load chamber 12a and an unload chamber 13a.

The air conveying unit 2 is provided with an air-conditioning mechanism that regulates an amount of dust in the air in the conveying chamber 2a. The air-conditioning mechanism has a hepafilter (see FIG. 2). By the air-conditioning mechanism, the amount of dust in the air in the conveying chamber 2a can be made smaller as compared with the outside air. Note that the air-conditioning mechanism can also control temperature or humidity in the conveying chamber 2a.

The load/unload chamber 10a of the load/unload apparatus 10 is a chamber for introducing/discharging a substrate into/from the air conveying unit 2.

The alignment treatment chamber of the aligner 9 is connected to the inside of the conveying chamber 2a, and is a treatment chamber for performing treatment of detecting the center position of the surface of the substrate 20. Furthermore, the aligner 9 is also provided with an air-conditioning mechanism that regulates the amount of dust in the air in the alignment treatment chamber. Consequently, the amount of dust in the air in the alignment treatment chamber can be made smaller than that of the outside air. Note that the air-conditioning mechanism can also control temperature or humidity in the alignment treatment chamber.

The drying treatment chamber 5a of the drying apparatus 5 is a treatment chamber that performs drying treatment on a film coated on the substrate by the spin coater 4. The drying treatment is treatment that removes, for example, alcohol, moisture etc. in the film.

As shown in FIG. 2, in the drying treatment chamber 5a, a hot plate 42 for holding and heating a substrate 41 is arranged. To the hot plate 42, a thermometer 43 is connected, which makes it possible to heat the hot plate 42 to an intended temperature (for example, 200° C.). The substrate 41 is made movable up and down by a lift 44 having a pin.

The drying apparatus 5 has an exhaust mechanism 46 that evacuates the inside of the drying treatment chamber 5a. The exhaust mechanism 46 has an exhaust port 45 arranged facing the substrate 41 held on the hot plate 42, and thus the air over the surface of a film coated on the substrate 41 can be exhausted directly from the exhaust port 45.

The temporary calcination treatment chamber 6a of the temporary calcination apparatus 6 is a treatment chamber for performing temporary calcination of an intended temperature (for example, 300° C. to 600° C.) for a film coated on the substrate 41 in a nitrogen atmosphere. In the temporary calcination apparatus 6, a lamp heater 42a for holding and heating the substrate 41 is arranged. To the lamp heater 42a, the thermometer 43 is connected, which makes it possible to heat the lamp heater 42a to an intended temperature. The substrate 41 is made movable up and down by the lift 44 having a pin. In addition, the temporary calcination apparatus 6 also has a gas introduction mechanism for setting the inside of the temporary calcination treatment chamber 6a to be a prescribed atmosphere, and an exhaust system (such as a vacuum pump) that exhausts the inside of the temporary calcination treatment chamber 6a. The gas introduction mechanism is one that introduces, for example, nitrogen. The temporary calcination treatment chamber 6a is connected to a nitrogen gas supply source, an oxygen gas supply source or a dry air supply source via piping, a valve and a mass flow controller MFC1. Furthermore, the inside of the temporary calcination treatment chamber 6a has a configuration in which the pressure can be reduced to around $10^{-2}$ Pa by an exhaust system having a vacuum pump such as a dry pump.

The annealing treatment chamber 7a of the pressurizing lamp annealing apparatus 7 is a treatment chamber for performing lamp annealing treatment on a film coated on a substrate, for example, at a temperature of 500 to 1000° C. The lamp annealing treatment can be performed also in any of pressurized, ordinary pressure and depressurized states.

The pressurizing lamp annealing apparatus 7 will be explained in detail.

As shown in FIG. 2, the pressurizing lamp annealing apparatus 7 has a chamber 51 made of Al. It is configured such that the chamber 51 is water-cooled by a cooling mechanism (not shown). In the chamber 51, a placing table 53 on which a substrate is to be placed is provided. The placing table 53 is formed from a material that allows lamp light to pass through, for example, quartz. Above the placing table 53, a quartz glass 54 is arranged.

Furthermore, above the quartz glass 54, a lamp heater 55 is arranged. The lamp heater 55 is arranged inside a housing 56 made of metal. To an upper part of the housing 56, an exhaust duct 57 is connected. The exhaust duct 57 is one for discharging heat in the housing 56.

In addition, in a lower part of the chamber 51 positioned on a lower side of the placing table 53, a window is provided. On the window, a calcium fluoride 58 is arranged. On a lower side of the calcium fluoride 58, a radiation thermometer 59 is arranged. The calcium fluoride 58 is arranged, in order to measure the temperature of substrate with the radiation thermometer 59, for a purpose of taking in light in a wavelength region to be measured (infrared ray of wavelength 5 μm). Furthermore, the apparatus 7 has the thermometer 52 for measuring temperature in the annealing treatment chamber 7a.

Moreover, the annealing treatment chamber 7a in the chamber 51 is connected to a pressurizing line (pressurizing mechanism) C2. The pressurizing line C2 has a pressurizing line by argon gas, a pressurizing line by oxygen gas and a pressurizing line by nitrogen gas.

In addition, the annealing treatment chamber 7a in the chamber 1 is connected to a pressure regulation line. It is configured such that the annealing treatment chamber 7a in the chamber 51 can be pressurized to a prescribed pressure (for example, less than 1 MPa) by the pressure regulation line and the pressurizing line C2. The pressure regulation line is provided with a variable valve 69, and one side of the variable valve 69 is connected to the annealing treatment chamber 7a via piping. The pipe is connected to a pressure gauge DG, and it is configured such that pressure in the annealing treatment chamber 7a can be measured by the pressure gauge DG. Another side of the variable valve 69 is connected to piping.

Furthermore, the annealing treatment chamber 7a is also connected to a safety line. The safety line is one for lowering the inside of the annealing treatment chamber 7a to atmospheric pressure, when the inside of the annealing treatment chamber 7a is abnormally pressurized too much to thereby give a pressure not less than a certain value. The safety line is provided with an opening valve. One side of the opening valve is connected to the annealing treatment chamber 7a via piping, the other side of the opening valve is connected to piping. The opening valve is configured such that gas flows when a pressure of a certain value is applied.

Moreover, the annealing treatment chamber 7a is connected to an atmospheric opening line. The atmospheric opening line is one that returns the inside of the normally pressurized annealing treatment chamber 7a to atmospheric pressure. The atmospheric opening line is provided with an opening valve. One side of the opening valve is connected to the annealing treatment chamber 7a via piping, and the other side of the opening valve is connected to piping. It is configured such that the opening valve allows a gas in the annealing treatment chamber 7a to flow gradually, in order to return the inside of the annealing treatment chamber 7a to atmospheric pressure.

In addition, the annealing treatment chamber 7a is connected to a line that returns a state to atmospheric pressure from a reduced pressure. The line is one that returns a state to atmospheric pressure from a reduced pressure when the inside of the annealing treatment chamber 7a is in a state of reduced pressure (vacuum). The line is provided with a leak valve. One side of the leak valve is connected to the annealing treatment chamber 7a via piping and the other side of the leak valve is connected to a flow amount regulation valve via piping. The flow amount regulation valve is connected to the nitrogen gas supply source through piping. That is, it is configured such that the line introduces gradually nitrogen gas into the annealing treatment chamber 7a from the nitrogen gas supply source via the flow amount regulation valve and the leak valve, thereby returning the inside of the annealing treatment chamber 7a to atmospheric pressure.

In addition, the annealing treatment chamber 7a is connected to a vacuum exhaust line for making the inside of the treatment chamber 7a be in a state of reduced pressure. The vacuum exhaust line has a valve, and one end of the valve is connected to the inside of the annealing treatment chamber 7a via piping. The other end of the valve is connected to the vacuum pump via piping. The vacuum exhaust line is used, for example, in such a case where vacuum exhaust is performed once before performing pressurized RTA.

Furthermore, each of the housing 56 and the lamp heater 55 is connected to a dry air supply source A2 via piping. Introduction of dry air into the housing and the lamp heater from the dry air supply source A2 makes it possible to exhaust heat that accumulates in the housing and in the lamp heater, from the exhaust duct 57.

The cooling treatment chamber of the cooling apparatus 8 is a treatment chamber for cooling a substrate having been subjected to drying treatment, temporary calcination treatment, lamp annealing treatment or the like.

In addition, the above-mentioned valve is connected to a pressurized air supply source for driving a valve via piping. Furthermore, each of the alignment treatment chamber of the aligner 9 and the conveying chamber 2a of the air conveying unit 2 is connected to the vacuum pump DP2 via piping.

Next, a method for manufacturing a thin film on a substrate by treating the substrate by using the above-mentioned substrate treatment apparatus will be explained. The thin film is, for example, a ferroelectric film such as a PZT film.

First, into the load/unload chamber 10a, a substrate is loaded.

After that, the substrate in the load/unload chamber 10a is conveyed into the alignment treatment chamber of the aligner 9 through the conveying chamber 2a by the conveying mechanism 11, and the substrate is held by the holding mechanism in the alignment treatment chamber.

In this case, in the inside of the conveying chamber 2a, the amount of dust in the air is regulated by the air-conditioning mechanism, and, in the inside of the alignment treatment chamber, the amount of dust in the air is regulated by the air-conditioning mechanism.

Then, treatment that detects the center position of the substrate surface is performed in the alignment treatment chamber. The reason why the treatment is performed is for detecting the center position of the substrate surface, and thus for matching the center position of the substrate surface and the rotation center of the substrate when performing spin-coating treatment.

Subsequently, the gate valve 23 of the spin-coating treatment chamber 4a is opened, the substrate in the alignment treatment chamber is conveyed into the spin-coating treatment chamber 4a through the conveying chamber 2a by the conveying mechanism 11, the substrate is held by the holding mechanism 21 in the spin-coating treatment chamber 4a, and the gate valve 23 is closed. In this case, in the inside of the spin-coating treatment chamber 4a, the amount of dust in the air is regulated by the air-conditioning mechanism.

After that, a process in which a film is coated on the substrate by spin-coating is performed in the spin-coating treatment chamber 4a.

The process will be explained in detail below.

While supplying a cleaning liquid onto the substrate by the cleaning nozzle 67, the substrate is rotated. Consequently, the substrate surface is cleaned. Next, the supply of the cleaning liquid is stopped, and by the rotation of the substrate, the cleaning liquid on the substrate is removed.

Next, while dropping the chemical material onto the substrate by the dropping nozzle 72, the substrate is rotated. Along with this, the cleaning liquid is dropped to the end part of the substrate surface by the edge rinse nozzle 77. Consequently, on the substrate, a chemical material film is coated. The reason why the cleaning liquid is dropped to the edge part of the substrate surface is that, since the thickness of the film in the edge part of the substrate is formed thicker than that at the center of the substrate when a film is coated on the substrate by spin-coating, the coating is performed while removing the film in the edge part of the substrate by the cleaning liquid. Accordingly, it is preferable to move gradually the edge rinse nozzle 77 from the edge part of the substrate toward the central side, and to thereby move gradually the position to which the cleaning liquid is dropped from the edge part of the substrate toward the central side.

Note that, in the embodiment, as shown in FIG. 3, the chemical material is supplied onto the substrate from one chemical material supply source 71, but it may also be possible to arrange a plurality of chemical material supply sources and to supply chemical materials obtained by a mixture of a plurality of materials at an intended mixing ratio, onto the substrate. In this case, by providing a control mechanism capable of controlling the intended mixing ratio, it is possible to supply a plurality of chemical materials onto the substrate, easily without an error of an operator.

After that, the gate valve 23 of the spin-coating treatment chamber 4a is opened, the substrate in the spin-coating treatment chamber 4a is conveyed into the drying treatment chamber 5a through the conveying chamber 2a by the conveying mechanism 11, the substrate is held by the holding mechanism in the drying treatment chamber 5a, and the gate valve 23 is closed.

After that, a process in which the chemical material film on the substrate is subjected to a drying treatment in the drying treatment chamber 5a, is performed.

This process will be explained in detail below.

While exhausting directly, from the exhaust port 45, air over the surface of the film coated on the substrate by the exhaust mechanism 46, the substrate is heated, for example, to 200 to 250° C. by the hot plate 42. Consequently, moisture etc. in the chemical material film is removed. Since the exhaust port 45 is arranged facing the substrate held on the hot plate 42, air over the surface of the film coated on the substrate can effectively be exhausted.

After that, the gate valve 24 of the temporary calcination treatment chamber 6a is opened, the substrate in the drying treatment chamber is conveyed, by the conveying mechanism 11, into the temporary calcination treatment chamber 6a through the conveying chamber 2a, the substrate is held by the holding mechanism in the temporary calcination treatment chamber 6a, and the gate valve 24 is closed.

After that, a process, in which the chemical material film on the substrate is subjected to temporary calcination, is performed in the temporary calcination treatment chamber 6a.

In detail, after vacuum-exhausting the inside of the temporary calcination treatment chamber 6a by the exhaust system, the inside of the temporary calcination treatment chamber 6a is set to be at ordinary pressure, in a vacuum atmosphere or in a nitrogen atmosphere or in an inert gas atmosphere by the gas introduction mechanism, and the chemical material film on the substrate is heated to an intended temperature (for example, from 300° C. to 600° C.) by the lamp heater 42a, to thereby perform temporary calcination.

After that, the gate valve 24 is opened, the substrate in the temporary calcination treatment chamber 6a is conveyed into the cooling treatment chamber of the cooling apparatus 8 through the conveying chamber 2a by the conveying mechanism 11, the substrate is held by the holding mechanism in the cooling treatment chamber, and the gate valve 24 is closed. After that, the substrate is cooled to an intended temperature in the cooling treatment chamber.

After that, the substrate in the cooling treatment chamber is conveyed into the alignment treatment chamber in the aligner 9 through the conveying chamber 2a by the conveying mechanism 11, and treatment that detects the center position of the substrate surface is performed in the alignment treatment chamber.

After that, the gate valve 23 of the spin-coating treatment chamber 4a is opened, the substrate in the alignment treatment chamber is conveyed into the spin-coating treatment chamber 4a through the conveying chamber 2a by the conveying mechanism 11, the substrate is held by the holding mechanism 21 in the spin-coating treatment chamber 4a, and the gate valve 23 is closed.

After that, in the same manner as that in the above-mentioned method, the process of the spin-coating treatment, the drying treatment and the temporary calcination treatment is repeated in a plurality of times (for example, 30 times), to thereby stack and form a plurality of chemical material films on the substrate. A larger number of repetition times of the treatment makes it possible to form a thicker film (for example, a film having a thickness of not less than 1 μm) on the substrate. In this case, the use of the above-mentioned substrate treatment apparatus can make it possible to improve the productivity. In detail, by causing the substrate treatment apparatus to operate as described above by a control part (not shown), it is possible to perform automatically the spin-coating treatment, the drying treatment and the temporary calcination treatment. Consequently, if each of treatment is performed individually and an operator conveys the substrate with hands, there may occur troubles in which the operator gets numbness in his/her hands, the order of treatment is mistook or the substrate is fallen during the conveyance, but there is an advantage that these do not occur. Accordingly, it is possible to improve the productivity and to enhance the yield in mass production.

After that, the gate valve 24 of the temporary calcination treatment chamber 6a is opened, the gate valve 25 of the pressurizing lamp annealing apparatus 7 is opened, the substrate in the temporary calcination treatment chamber 6a is conveyed into the annealing treatment chamber 7a through the conveying chamber 2a by the conveying mechanism 11, the substrate is held by the holding mechanism, and gate valves 24 and 25 are closed. Note that, when the chemical material film on the substrate is a ferroelectric film, a conveying time of the substrate from the inside of the temporary calcination treatment chamber 6a into the annealing treatment chamber 7a is preferably not more than 10 sec.

The reason why the conveying time is made short in this way is as follows. A long conveying time gives large influence on properties of the ferroelectric film. In detail, after the temporary calcination, oxygen activity in the chemical material film is very high to thereby lead to anoxic conditions, and thus the film is bonded with oxygen in the air and properties of the film are deteriorated. Accordingly, it is preferable to shorten the conveying time.

After that, a process in which the chemical material film having a plurality of layers on the substrate is subjected to the lamp annealing treatment in the annealing treatment chamber 7a, is performed.

In detail, the annealing treatment is performed by setting the inside of the annealing treatment chamber 7a to be in a state of a prescribed atmosphere and a prescribed pressure (increased pressure, ordinary pressure or reduced pressure) and by heating the chemical material film on the substrate to an intended temperature by the lamp heater 55. When the chemical material film is a ferroelectric film, the annealing treatment crystallizes the ferroelectric film.

After that, the substrate in the annealing treatment chamber 7a is conveyed into the load/unload chamber 10a through the conveying chamber 2a by the conveying mechanism 11, and the substrate is unloaded.

Examples

The Examples are for manufacturing a thin film on a substrate by using the substrate treatment apparatus shown in FIGS. 1 to 4.

A 25 wt % Pb 15% excess sol-gel PZT solution (Pb/Zr/Ti=115/52/48) was used to perform spin-coating onto a substrate. PZT thick film coating was applied onto a substrate by using 500 µL as a coating amount each time, under following spin conditions.

A rotation rate is raised from 0 to 300 rpm in 3 sec, kept for 3 sec, and, after that, the rotation rate is raised from 300, rpm to 500 rpm in 5 sec, kept for 5 sec, and, after that, the rotation rate is raised from 500 rpm to 1500 rpm in 5 sec and kept for 90 sec.

Subsequently, as a drying process, the substrate was held on a hot plate heated to 250° C. for 30 sec and moisture was removed from the coated PZT thick film.

Next, the sample having been subjected to processes up to the above-mentioned drying process was subjected to temporary calcination treatment. In detail, a rotary pump was used to evacuate the inside of the temporary calcination treatment chamber 6a and thereby to make the ultimate vacuum be $10^{-1}$ Pa. After that, the inside of the temporary calcination treatment chamber 6a was filled with $N_2$ up to atmospheric pressure, and the substrate was heated at 450° C. for 90 sec to thereby decompose and remove organic components.

Subsequently, as a Comparative example, the sample having been subjected to processes up to the above-mentioned drying process was subjected to a temporary calcination process different from that in the Example. In detail, a temporary calcination was performed at 450° C. for 90 sec in the air (containing oxygen) at atmospheric pressure. This sample is set as a product of a conventional example 1.

The spin-coating, drying process and temporary calcination processes were repeated 15 times and samples of PZT thick films having a total thickness of 5 µm formed on substrates, respectively (Example and Conventional example 1), were fabricated.

Next, the 5 µm PZT thick film on each of the substrates of the above-mentioned samples (Example and Conventional example 1) was subjected to lamp annealing treatment by a rapid heating apparatus (RTA), and thus the PZT thick film was crystallized. In detail, in the crystallization, the PZT thick film of the Example was heated up to 700° C. at a temperature-rise rate of 100° C./sec in an oxygen atmosphere pressurized to 9.9 atm and was kept for 1 min to thereby perform the crystallization. As described above, the calcination was performed together in the film thickness of 5 µm.

For comparison, in atmospheric pressure oxygen, the PZT thick film having a total thickness of 5 µm was heated up to 700° C. at a temperature-rise rate of 100° C./sec and kept for 1 min, and thus the crystallization was performed. This was set as a product of a conventional example 2.

FIG. 5A is a SEM cross-section image of the 5 µm PZT thick film of the present invention (Example), and FIG. 5B is a SEM cross-section image of the 5 µm PZT thick film of the conventional example 1.

Figure 6B:
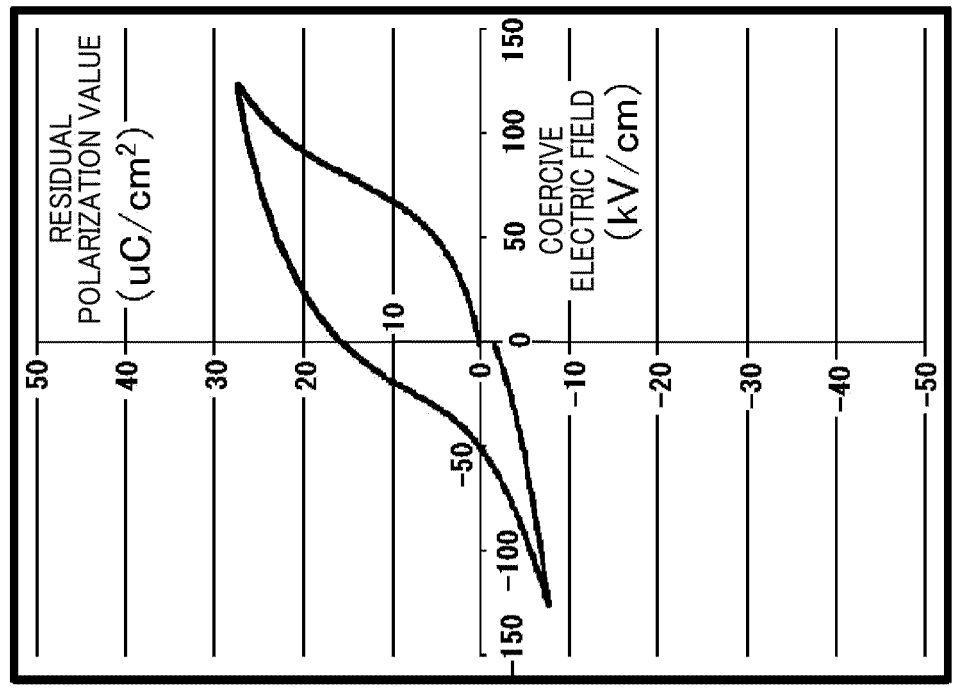
FIGS. 6A and 6B are drawings that compare D-E hysteresis characteristics between a PZT thick film of the present invention (Example) and a PZT thick film in Conventional example 1.
Figure 6A:
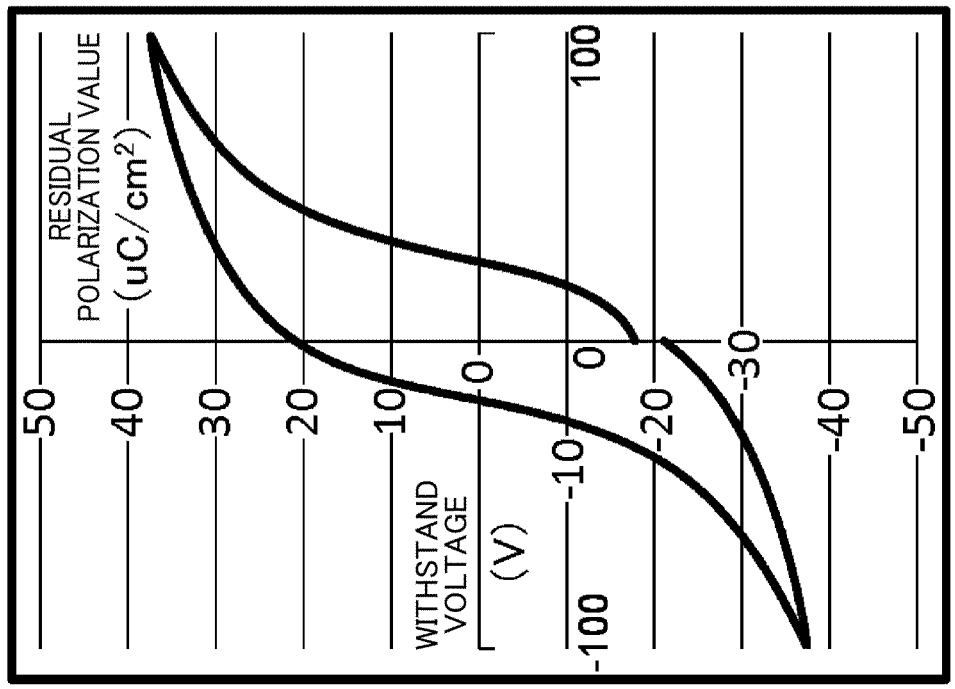

FIG. 6A is a drawing showing a result of hysteresis evaluation of the 5 µm PZT thick film of the present invention (Example), and FIG. 6B is a drawing showing a result of hysteresis evaluation of the 5 µm PZT thick film of the conventional example 1.

As shown in FIG. 6A, in the present invention (Example), good hysteresis was obtained, but in contrast, as shown in FIG. 6B, in the conventional example 1, a very deformed small hysteresis curve was given.

Figure 7B:
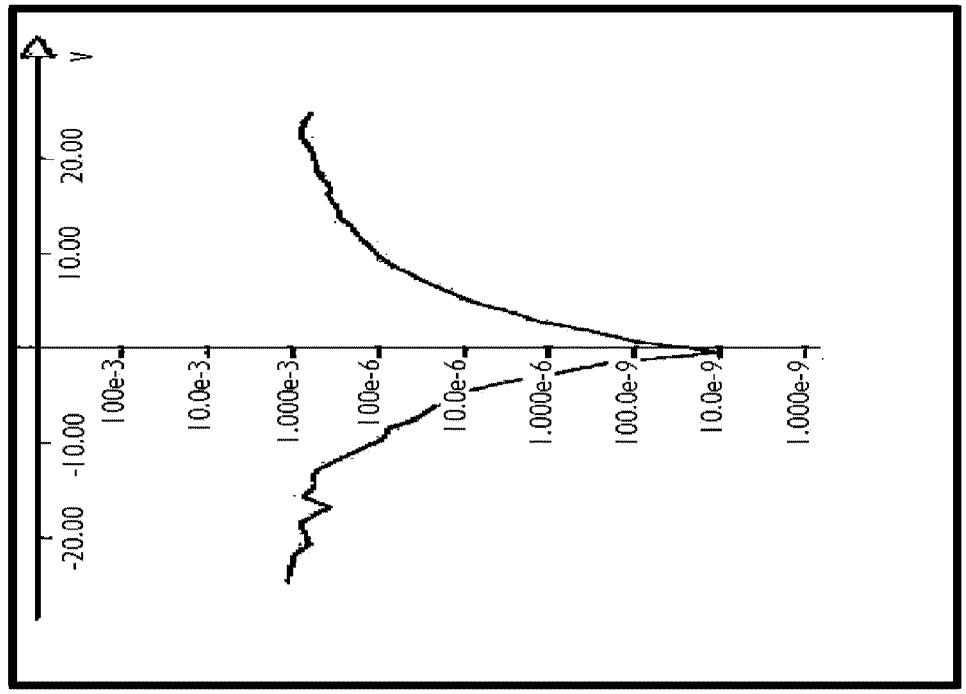
FIGS. 7A and 7B are drawings that compare leak current densities between a PZT thick film of the present invention (Example) and a PZT thick film in Conventional example 1.
Figure 7A:
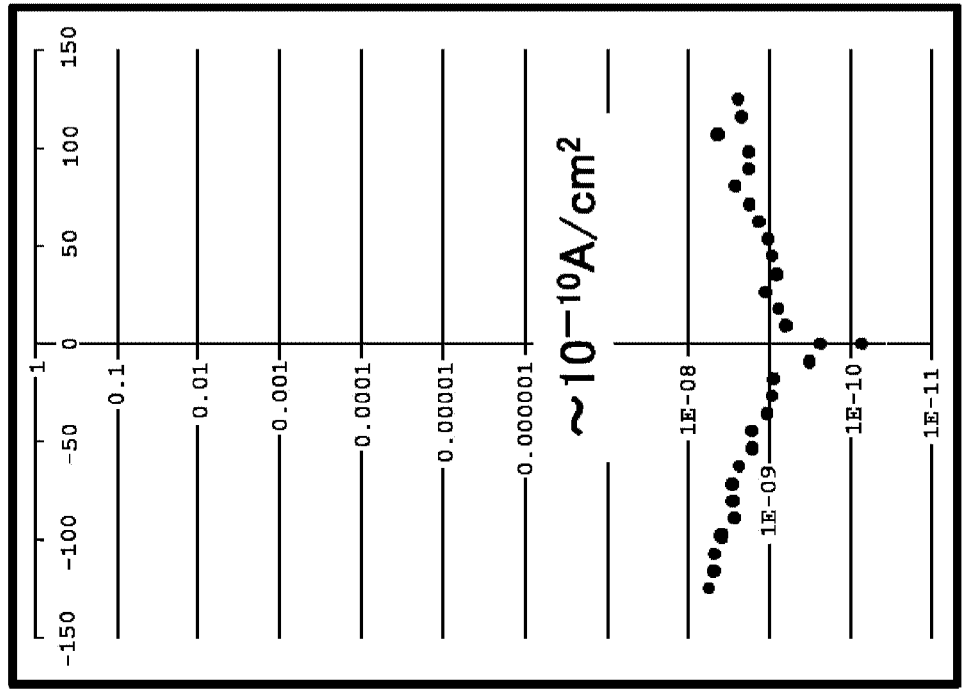

FIG. 7A is a drawing showing a measurement result of a leak current density for the 5 µm PZT thick film of the present invention (Example), and FIG. 7B is a drawing showing a measurement result of a leak current density for the 5 PZT thick film of the conventional example 1.

As shown in FIG. 7A, in the present invention, good leak properties were shown, but in contrast, as shown in FIG. 7B, in the conventional example 1, a very large leak current such as $10^{-6}$ to $10^{-3}$ A/cm$^2$ was recognized.

FIG. 8A is a drawing showing a result of Raman spectroscopy of the 5 µm PZT thick film of the present invention (Example), FIG. 8B is a drawing showing a result of Raman spectroscopy of the 5 µm PZT thick film of the conventional example 1, and FIG. 8C is an enlarged view of B shown in FIG. 8B.

As shown in FIG. 8C, in the conventional example 1, peaks of oxides of elemental substances of the PZT composition such as Pb, Zr and Ti were mixed together.

Here, the pressurized RTA was further examined in detail.

Figure 9:
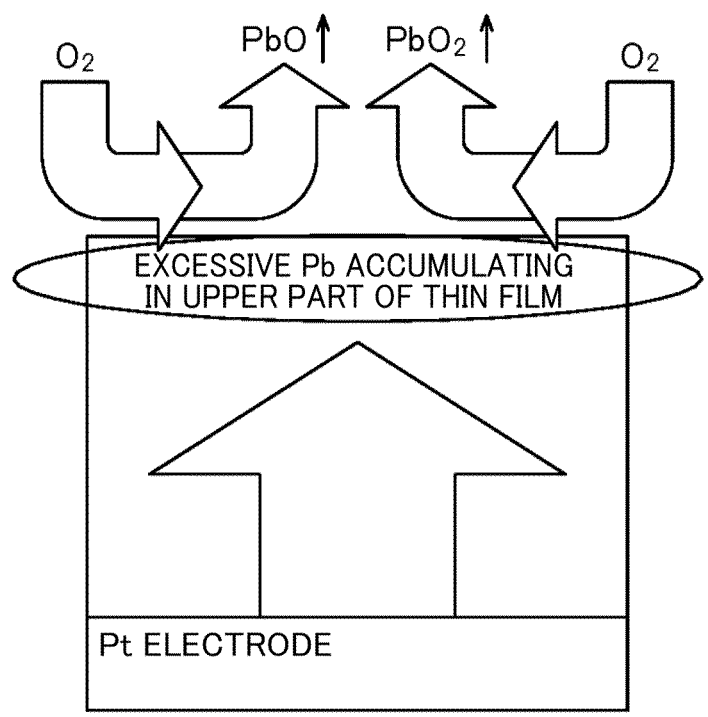
FIG. 9 is a schematic view showing a concept of pressurized RTA.

The concept of the pressurized RTA is as shown in FIG. 9. In detail, initial nuclei for PZT crystallization are generated in a state of excessive lead, but, since the PZT crystal itself is stoichiometric, oxidation of excessive lead accumulated on an upper part of a thin film is accelerated with pressurized oxygen, to thereby remove the lead.

Figure 10:
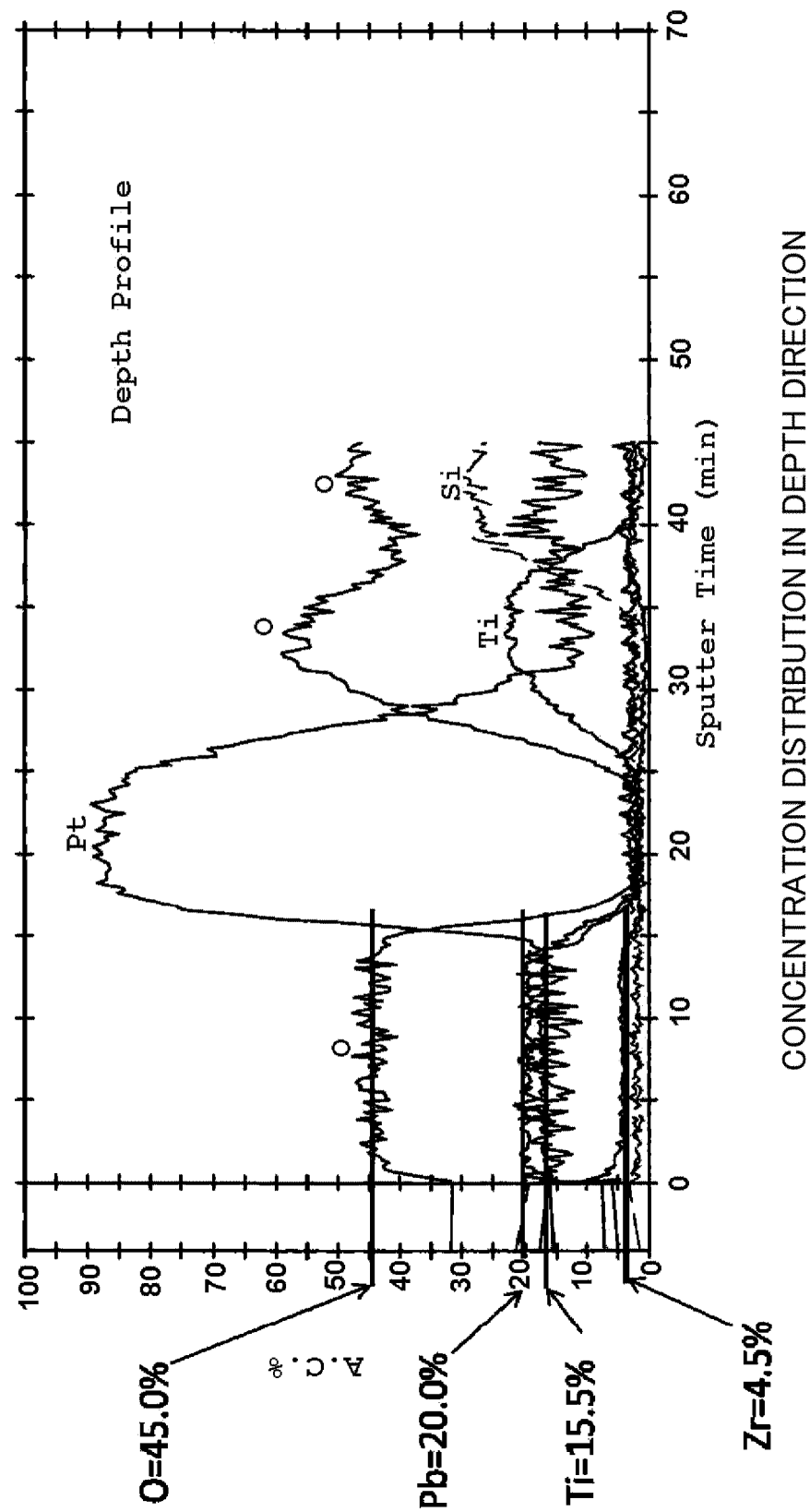
FIG. 10 is a drawing showing a concentration distribution in the depth direction of a PZT thick film of the present invention (Example) sintered in pressurized oxygen.

In the PZT thick film of the present invention, which was crystallized in 9.9 atm oxygen, as shown in FIG. 10, Pb=Zr+Ti holds and all the excessive lead had been removed.

Figure 11:
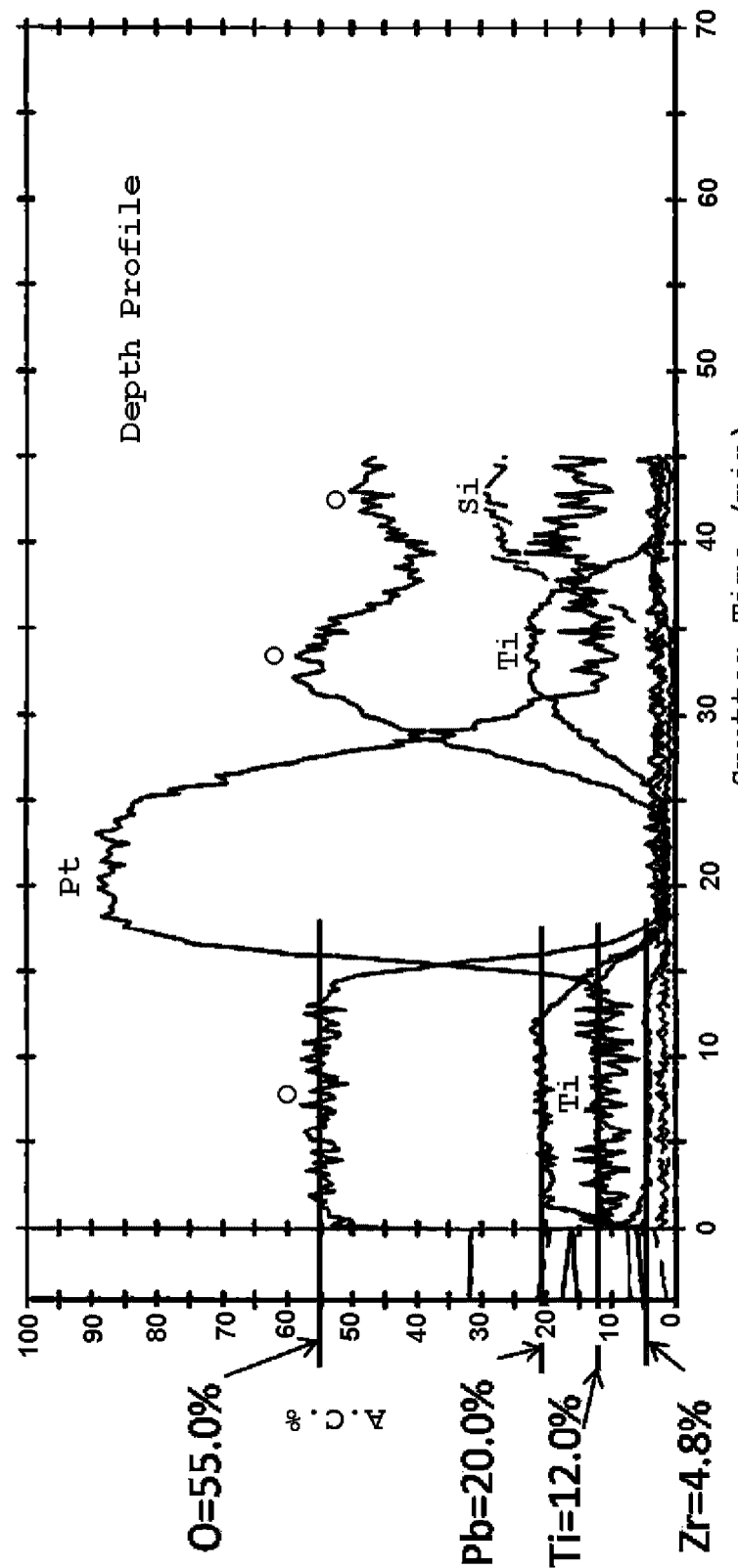
FIG. 11 is a drawing showing a concentration distribution in the depth direction of a PZT thick film in Conventional example 2 sintered in atmospheric pressure oxygen.

In contrast, in the case of the conventional example 2, on which the crystallization was performed in atmospheric pressure oxygen, it has been found that, as shown in FIG. 11, Pb>Zr+Ti holds, and that the thick film contains excessive lead as it was.

In addition, from FIGS. 10 and 11, it has been found that the film of the conventional example 2 contains more oxygen.

An absolute value of a light element such as oxygen is not clearly known, but, by comparison with the PZT thick film of the present invention, it was suggested that the film of the conventional example 2 contains more oxygen.

It is considered that this is because the Pb component observed in large amounts in the film of the conventional example 2 exists as an impurity of PbOx, at the grain boundary of PZT.

DESCRIPTION OF REFERENCE NUMERALS AND SIGNS

1: coating unit
2: air conveying unit
2a: conveying chamber
4: spin coater
4a: spin-coating treatment chamber
5: drying apparatus
5a: drying treatment chamber
6: temporary calcination apparatus
6a: temporary calcination treatment chamber
7: lamp annealing apparatus
7a: annealing treatment chamber
8: cooling apparatus
9: aligner
10: load/unload apparatus
10a: load/unload chamber
11: conveying mechanism
23 to 25: gate valve

The invention claimed is:

1. A substrate treatment apparatus, comprising:
a spin-coating treatment chamber configured to coat a film on a substrate by spin-coating;
a first air-conditioning mechanism configured to regulate an amount of dust in an air in said spin-coating treatment chamber;
an annealing treatment chamber configured to perform lamp annealing treatment on said film coated on the substrate;
a conveying chamber that is connected to each of said spin-coating treatment chamber and said annealing treatment chamber and is configured to convey the substrate between said spin-coating treatment chamber and said annealing treatment chamber; and
a second air-conditioning mechanism configured to regulate an amount of dust in an air in said conveying chamber,
wherein said spin-coating treatment chamber includes a rotation mechanism configured to rotate the substrate, a first nozzle configured to drop a chemical material onto the substrate rotated by the rotation mechanism, and a second nozzle configured to drop a cleaning liquid onto the film of the chemical material at an edge part of the substrate surface while dropping the chemical material onto the substrate by the first nozzle,
wherein the first nozzle is configured to drop the chemical material while an excess of the film built-up at the edge of the substrate is removed by the cleaning liquid dropped by the second nozzle.

2. The substrate treatment apparatus according to claim 1, further comprising a temporary calcination treatment chamber that is connected to the inside of said conveying chamber and is configured to temporarily calcinate the film coated on the substrate.

3. The substrate treatment apparatus according to claim 1, further comprising:
a drying treatment chamber that is connected to said conveying chamber and configured to perform drying treatment on the film coated on the substrate; and
an exhaust mechanism that exhausts the inside of said drying treatment chamber.

4. The substrate treatment apparatus according to claim 3, wherein:
a holding mechanism that holds the substrate is arranged in said drying treatment chamber; and
said exhaust mechanism has an exhaust port arranged facing the substrate held by said holding mechanism to exhaust directly an air over a surface of the film coated on the substrate from said exhaust port.

5. The substrate treatment apparatus according to claim 1, further comprising:
an alignment treatment chamber that is connected to the inside of said conveying chamber and configured to detect a center position of the substrate surface; and
a third air-conditioning mechanism configured to regulate an amount of dust in an air in said alignment treatment chamber.

6. The substrate treatment apparatus according to claim 1, wherein a conveying mechanism that conveys the substrate is provided in said conveying chamber.

7. The substrate treatment apparatus according to claim 1, wherein said first air-conditioning mechanism controls temperature or humidity or an airflow volume.

8. The substrate treatment apparatus according to claim 1, wherein said lamp annealing treatment is performed in any of pressurized, ordinary pressure and depressurized states.

9. A method for manufacturing a thin film on a substrate by using a substrate treatment apparatus comprising:
a spin-coating treatment chamber configured to coat a film on a substrate by spin-coating;
a first air-conditioning mechanism configured to regulate an amount of dust in an air in said spin-coating treatment chamber;
an annealing treatment chamber configured to perform lamp annealing treatment on the film coated on the substrate;
a conveying chamber connected to each of said spin-coating treatment chamber and said annealing treatment chamber and configured to convey the substrate between said spin-coating treatment chamber and said annealing treatment chamber; and
a second air-conditioning mechanism configured to regulate an amount of dust in an air in said conveying chamber,
wherein said spin-coating treatment chamber includes a rotation mechanism configured to rotate the substrate, a first nozzle configured to drop a chemical material onto the substrate rotated by the rotation mechanism, and a second nozzle configured to drop a cleaning liquid onto the film of the chemical material at an edge part of the substrate surface while dropping the chemical material onto the substrate by the first nozzle, wherein the first nozzle is configured to drop the chemical material while an excess of the film built-up at the edge of the substrate is removed by the cleaning liquid dropped by the second nozzle; and a temporary calcination treatment chamber connected to the inside of the conveying chamber and configured to temporarily calcinate the film coated on the substrate, said method comprising:

a first step of coating a film on the substrate by spin-coating, in said spin-coating treatment chamber in which an amount of dust in an air is regulated by said first air-conditioning mechanism;

after said first step, a second step of conveying the substrate in said spin-coating treatment chamber into said temporary calcination treatment chamber through said conveying chamber;

after said second step, a third step of performing temporary calcination on the film on the substrate in said temporary calcination treatment chamber;

after said third step, a fifth step of stacking and forming a plurality of films on the substrate by repeating a fourth step of conveying the substrate in said temporary calcination treatment chamber into said spin-coating treatment chamber through said conveying chamber, said first step, said second step and said third step;

after said fifth step, a sixth step of conveying the substrate in said temporary calcination treatment chamber into said annealing treatment chamber through said conveying chamber; and after said sixth step, a seventh step of performing lamp annealing treatment on the plurality of films on the substrate in said annealing treatment chamber, wherein, in said conveying chamber, an amount of dust in an air is regulated by said second air-conditioning mechanism.

10. The method for manufacturing a thin film according to claim 9, wherein said temporary calcination is performed in a vacuum atmosphere or in a nitrogen atmosphere or in an inert gas atmosphere.

11. The substrate treatment apparatus according to claim 1, wherein said spin-coating treatment chamber comprises a third nozzle configured to supply a cleaning liquid onto the substrate to clean the substrate surface.

12. The substrate treatment apparatus according to claim 1, wherein said spin-coating treatment chamber comprises a second swing arm configured to move the first nozzle to an upper side of the substrate when dropping the chemical material onto the substrate, and a third swing arm configured to move the second nozzle to an upper side of the edge part of the substrate when dropping the cleaning liquid to the edge part of the substrate surface.

13. The substrate treatment apparatus according to claim 11, wherein said spin-coating treatment chamber comprises a first swing arm configured to move the third nozzle to an upper side of the substrate when supplying the cleaning liquid onto the substrate.

* * * * *